INDICATING AND CONTROL MEANS FOR COAXIAL SHAFTS

Filed June 26, 1964

INVENTOR.
ARTHUR M. ROBSON
BY Darby & Darby
ATTORNEYS

United States Patent Office 3,446,181
Patented May 27, 1969

3,446,181
INDICATING AND CONTROL MEANS FOR COAXIAL SHAFTS

Arthur M. Robson, Brooklyn, N.Y., assignor to Lear Siegler, Inc., Long Island City, N.Y., a corporation of Delaware Filed June 26, 1964, Ser. No. 378,286
Int. Cl. H03j 1/04
U.S. Cl. 116—124.4 5 Claims

ABSTRACT OF THE DISCLOSURE

An arrangement of shaft and coaxial sleeves to provide indication of the position of the shaft and of one of the sleeves. This device is particularly useful in a television receiver, the shaft being connected to the shaft of a very high frequency tuner or channel selector, while a sleeve on the shaft is operated by a member on the forward side of the television receiver panel and controls the position of a fine tuning device for the VHF channel selector and of a UHF tuner, the tuner in turn being connected to another sleeve on the shaft and to a second indicator disc which indicates the position of the UHF tuner through the panel window so that the positioning of the VHF channel selector is indicated in a window when that selector is effective, and the position of the UHF tuner or channel selector is indicated through the same window when the VHF channel selector is turned to a particular position and the UHF tuner thus rendered effective.

Figures 1, 2, 3:
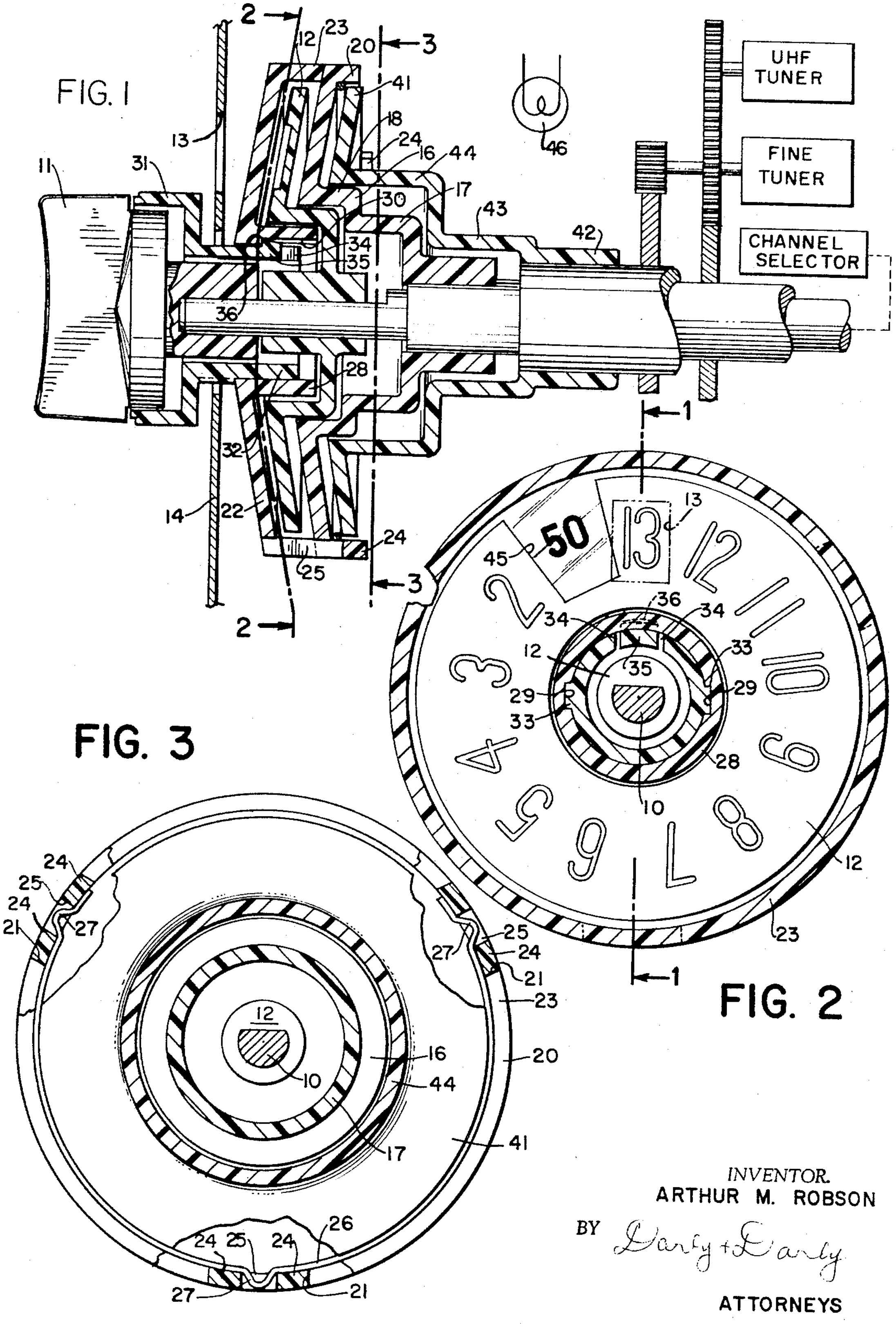

The present invention relates to indicating means for indicating the position of a shaft and of a coaxial sleeve mounted on that shaft.

More particularly the present invention relates to indicating the positions of the shaft and sleeve through a single window in a panel through which the shaft and sleeve extends with the control knobs for the shaft and sleeve on the opposite side of the panel from the indicating means.

While not limited thereto the indicating means of the present invention is particularly useful in indicating the position of the channel selector of a television receiver, the coaxial sleeve carrying a means for indicating the position of the ultra high frequency tuning device, the position of both the channel selector and the ultra high frequency tuner being indicated in a single window of the front panel of the television receiver.

The operating knob which causes channel selection operates the inner shaft while another knob operates a sleeve which, when the channel selector is in VHF position, is effective to fine tune to a very high frequency channel and when the channel selector is in a particular position not associated with any very high frequency channel serves to operate the UHF tuner and in turn through a second sleeve to operate the indicating means to show the position and thus the station in the Ultra high frequency band to which the receiver has been tuned. The indicating means of this invention is an improvement upon the indicating means described in application Ser. No. 160,723, filed Dec. 20, 1961, now abandoned and assigned to the assignee of this invention.

It is an object of the invention to provide indicating and control means for coaxial shaft and sleeve arrangements wherein the position of both the shaft and a sleeve associated therewith are indicated through a single observation window in a panel which is placed between the indicating means and the shaft and sleeve control means.

It is another object of the invention to provide indicating means of the type mentioned which are of a sufficiently large diameter to make the indications thereon readable at a considerable distance and angularly spaced sufficiently to assure precision of adjustment of the shaft and particularly of the sleeve.

It is a further object of the invention to provide such coaxial shaft control and indicating means which are readily produced and assembled and the control members of which are small enough as to be unobstrusive and not to mar the appearance of the face panel of a television receiver.

Other objects and features of the invention will be apparent when the following description is considered in connection with the annexed drawings, in which, FIGURE 1 is a vertical longitudinal cross sectional view of the coaxial shaft and sleeve control and indicating means of the present invention, the view being taken on the plane of the line 1—1 of FIGURE 2;

FIGURE 2 is a transverse cross sectional view of the device of FIGURE 1, the view being taken on the line 2—2 of FIGURE 1; and FIGURE 3 is a transverse cross sectional view of the device of FIGURE 1 taken on the plane of the line 3—3 of FIGURE 1.

Referring now to the drawings, the shaft 10, which may for example be the shaft of the television tuner which is used for VHF channel selection, has mounted thereon a knob 11 and an indicator dial 12. It will be understood that the shaft 10 extends forwardly from the television VHF channel selector or tuner mounted within a receiver cabinet and extends through an aperture 9 in the front panel 14 of the television receiver. Mounted coaxially to the shaft 10 is a sleeve 15 which likewise extends forwardly and which sleeve may, for example, control the fine tuning mechanism of the VHF channel selector so that the fine tuning may be effected after selection of a channel by the rotation of the shaft 10.

Mounted on the sleeve 15 for rotation therewith, is a disc 16 which extends radially outward and is of greater diameter than the indicator dial 12. Disc 16 has a number of offsets therein as indicated at 17 and 18, these offsets being provided for the purpose of assuring that the indicator dial 12 and other portions of the mechanism later to be described will lie closely adjacent each other and likewise be close to the front panel 14.

The disc 16 has a rearwardly extending flange 20 which flange has portions of its periphery notched out as indicated at 21, FIGURES 1 and 3. The disc 16 is arranged to be driven by means of a disc 22 which is shaped generally like disc 16, each of the discs being made of light transmitting material for reasons which will be discussed hereinafter.

Disc 22 has a rearwardly extending peripheral flange 23 thereon, this flange being provided with rearwardly extending lugs 24 at spaced points about its periphery, see FIGURES 1 and 3. The lugs 24 are of such circumferential width that they fit closely within the notches or recesses 21 formed in the flange 20 of disc 16 so that the discs 16 and 22 become, in effect, a single member surrounding the indicator dial 12.

Centrally of each rearwardly extending lug 24 of the disc 22 is a slot 25, these slots serving in connection with a spring wire member 26, FIGURES 1 and 3, to lock the two discs together. This locking is accomplished by providing the spring wire member 26 with outwardly extending U bends 27 which extend into the slots 25, lying rearwardly of the rear surface of flange 20 of disc 16 and forwardly of the rear end of the slots 25 in lugs 24. It will be clear from the above description that the spring wire member 26 is originally formed in a circular formation, the diameter of which is slightly greater than the inner diameter of flange 20 so that the spring member bears against the inner surface with the bent portions 27 extending into the slots as described.

Disc 22 is formed with a hollow hub 28 having keyways 29 extending longitudinally thereof at the sides as seen in FIGURE 2 and having in addition a keyway 30 extending longitudinally from a point rearwardly of the forward surface of the disc to the rear of the hub.

Mounted within the hub portion 28 of the disc 22 is a control knob 31, the mounting being accomplished by providing a rearwardly extending flange 32 having ribs 33 formed thereon. Ribs 33 extend into the keyways 29 and thus assure that rotational movement of the knob will be imparted to the disc. Flange 32 is slotted at 34 to form a flexible finger 35 which is provided with a projection 36 which extends radially outwardly and the outer surface of which slopes toward the rear. This finger is thus caused to flex inwardly as the knob is inserted into the hub 28 riding along the inner surface of that hub.

When the knob is fully inserted into the hub the finger 35 springs outwardly into the keyway 30 so that the projection 36 lies behind the forwardly terminating end of keyway 30 and locks the control knob 31 into the hub 28. It will be understood that the finger 35 is sufficiently flexible and the extent of projection 36 sufficiently slight so that the control knob 31 may be removed from the hub to permit removal of the television receiver chassis from its cabinet when necessary.

The sleeve 40 is rotated in accordance with the adjustment of the UHF section of the television tuner which section is in turn controlled either directly or indirectly by the sleeve 15. Frequently the sleeve 15 drives gearing which in turn operates the UHF tuner although at times the gearing is omitted and the UHF tuner is driven directly from the sleeve 15. In any event the position of the sleeve 40 is coordinated with the position of the UHF tuning elements.

Mounted on sleeve 40 for rotation therewith is an indicator dial 41 having a hub portion 42 and various offset portions 43 and 44, these offsets being provided in order that the dial 41 be located closely adjacent to the rear surface of the disc 16.

As has been indicated above, rotation of control knob or ring 31 is effective through the discs 22 and 16 to drive the sleeve 15 and thus ordinarily to simultaneously drive the fine tuning mechanism associated with the VHF tuner and the UHF tuning elements. However, when the UHF tuning elements are in use the shaft 10 is in a position intermediate the VHF channel 13 and channel 2 positions and due to electrical switching the VHF tuning circuits are ineffective and only the UHF circuits are effective.

Dial indicator 12 is provided with transluscent numerals indicating the VHF television channels 2 through 13, these numerals appearing upon an opaque background. This dial is also provided with a cutout 45 in one of the 13 positions thereof. The cutout portion 45 serves to render visible a portion of the UHF indicator dial 41 which lies behind the dial 12. The UHF indicator dial is provided with a series of numerals to indicate UHF channels numbered from 14 through 83, these numerals being opaque and the rim portion of the dial on which they appear being translucent.

A light source 46 is provided to the rear of the indicator dial 41, this light illuminating the upper portions of the dial and rendering the dial visible through a window or aperture 13 in the face panel 14 of the television receiver.

When a VHF channel is to be selected the knob 11 is turned until the numeral associated with the desired channel appear behind the window 13. This numeral will be illuminated because the dial 41 is translucent, and the discs 16 and 22 are transparent so that the numeral only will be illuminated. When it is desired to tune the television receiver to a UHF channel the knob 11 is first rotated to a position such that the cutout 45 is behind the window 13. At this time the opaque numerals on disc 41 such as the numeral 50, shown in FIGURE 2, will appear behind the window and by rotating the knob 31 the UHF channel may be selected, the channel indication being given by virtue of the fact that rotation of knob 31 and of the tuning elements of the UHF tuner results in proportional rotation of the sleeve 40 and indicator dial 41.

As stated before, sleeve 15 is also effective in any position of the VHF control to operate the fine tuning elements associated with the VHF channels, but when the knob 11 is rotated to cause the cutout 45 to be behind the window 13 switching devices, not shown, cause the VHF tuner circuits to be ineffective and the UHF tuner to become effective.

It will be seen from the above that the coaxial shaft control of my invention provides a means for indicating the channel selection of both UHF and VHF tuners which indication is presented on a disc of a considerable diameter thus spreading the indications over the dial and making accurate tuning readily achieved. It will of course be appreciated that although reference has been made throughout this description to use of my coaxial shaft control and indication as applied to television receivers and particularly to receivers having provision for both UHF and VHF reception, many other uses for this device are possible.

While I have described a preferred embodiment of the invention, it will be understood that I wish to be limited not by the foregoing description, but solely by the claims granted to me.

What is claimed is:

1. An indicating device of the type described, comprising in combination, a shaft, a panel through which said shaft extends, an operating knob fixed to said shaft forwardly of said panel, a first indicator disc fixed to said shaft rearwardly of said panel, a window in said panel radially outward of said shaft and in substantial alignment with indicia on said first indicator disc, a first sleeve mounted on said shaft for rotation thereabout, said sleeve being positioned rearwardly of said first indicator disc, an annular knob rotatably mounted on said shaft forwardly of said panel, a pair of light-transmitting disc shaped members, one mounted on said annular knob and one on said first sleeve, said members being of greater radius than said first indicator disc and lying on opposite sides thereof, means interlocking said members adjacent their peripheries, a second sleeve rotatably mounted on said first sleeve, means driven by said first sleeve for positioning one controlled device, means driven by said controlled device for rotating said second sleeve, a second indicator disc fixed to said second sleeve, said second indicator disc lying axially closely adjacent the rearward one of said disc shaped members whereby indicia on said first and second discs may be viewed through said panel window.

2. Indicating means as claimed in claim 1 wherein said first indicator disc is opaque and has angularly spaced indicia adjacent its periphery, said indicia being translucent and wherein said second indicator disc has angularly spaced indicia adjacent its periphery in radial alignment with the indicia of said first disc, the indicia of said second disc being opaque and on a translucent background and wherein a light source is provided to the rear of said second indicator disc in alignment with the face panel window whereby the indicia of said discs are illuminated.

3. A device as claimed in claim 1 wherein said first indicator disc has a transparent section adjacent its periphery and in radial alignment with said angularly spaced translucent indicia, whereby when said transparent section is in alignment with the panel window, said second indicator disc may be viewed through said window, said disc-like members and said transparent section, and when said transparent section is out of alignment with said panel window indicia of said first disc are illuminated by light transmitted through said second indicator disc and said rearwardly mounted disc member, said illuminated indicia being viewed through the face panel window and said forward disc-like member.

4. An indicating device of the type described comprising, in combination, a shaft a coaxial sleeve mounted thereon, a panel through which said shaft extends, a window in said panel, a manually operable control knob fixed to said shaft for rotation thereof, a first indicator disc fixed on said shaft at the rear of said panel, a drive means for said sleeve, said drive means comprising a pair of generally disc-shaped members of greater radius than said first indicator disc, one on each side of said first indicator disc, said member being interlocked adjacent their peripheries, one of said members being fixed on the sleeve for rotation therewith, and the other having a hub coaxial with said sleeve and shaft, a control knob fixed within said hub and extending through said face panel to the forward side thereof, said disc members being provided with transparent areas, a second sleeve mounted for rotation about said first sleeve and driven by said first sleeve, a second indicator disc mounted on said second sleeve for rotation therewith, said second indicator disc lying closely adjacent the rearward one of said disc-shaped member whereby said indicator discs can be viewed through said window in said panel.

5. Indicating means as claimed in claim 1 wherein said locking means for said disc-like members comprises lugs extending from the periphery of one of said members into notches in the periphery of the second said member, said lugs being slotted parallel to the disc's axis, and a resilient member having radially extending projections thereon, said resilient member pressing against the inner periphery of said second disc member, said projections extending into said slots to thereby lock said lugs in said notches.

References Cited

UNITED STATES PATENTS 3,240,182 3/1966 Kemeny ---------- 116—124.4

LOUIS J. CAPOZI, *Primary Examiner.*